United States Patent [19]

Miller et al.

[11] Patent Number: 5,406,590
[45] Date of Patent: Apr. 11, 1995

[54] METHOD OF AND APPARATUS FOR CORRECTING EDGE PLACEMENT ERRORS IN MULTIPLYING PHASE LOCKED LOOP CIRCUITS

[75] Inventors: Joseph P. Miller, Houston; Paul R. Culley, Cypress, both of Tex.

[73] Assignee: Compaq Computer Corporation, Houston, Tex.

[21] Appl. No.: 965,189

[22] Filed: Oct. 23, 1992

[51] Int. Cl.$^6$ ............................................. H03D 3/24
[52] U.S. Cl. ......................................... 375/376; 331/10; 371/1; 327/159; 327/175
[58] Field of Search .................. 375/120, 118; 331/10, 331/DIG. 2, 1 R, 17, 25, 34; 371/1; 307/269, 271, 265, 266, 267; 329/325, 323, 324; 455/260, 75, 76; 332/127, 126; 328/155

[56] References Cited

U.S. PATENT DOCUMENTS

| | | | |
|---|---|---|---|
| 5,027,087 | 6/1991 | Rottinghaus | 331/10 |
| 5,144,260 | 9/1992 | Stribling et al. | 331/10 |
| 5,193,013 | 3/1993 | Swanberg | 331/10 |
| 5,254,958 | 10/1993 | Flach et al. | 331/10 |

Primary Examiner—Stephen Chin
Assistant Examiner—Hai H. Phan
Attorney, Agent, or Firm—Pravel, Hewitt, Kimball & Krieger

[57] ABSTRACT

A method of starting up a system clock that has been generated by a phase-locked loop and correcting edge placement errors during coasting periods of the phase locked loop, and circuitry for accomplishing those methods. A low frequency master clock signal is distributed to circuits that generate high frequency local clock signals. These circuits generate the high frequency local clock signals using phase-locked loops in a frequency multiplier configuration. Lock indicator circuitry determines when the phase-locked loop has locked onto the master clock signal and then enables output buffers that then provide the high frequency clock signals to components in the system which need those local clocks. An intermediate frequency signal is fed back to the input of the voltage controlled oscillator in the phase locked loop to correct edge placement errors. A slightly earlier or leading version of the signal is used to correct cycle length variations without inducing duty cycle variations.

9 Claims, 5 Drawing Sheets

METHOD OF AND APPARATUS FOR CORRECTING EDGE PLACEMENT ERRORS IN MULTIPLYING PHASE LOCKED LOOP CIRCUITS

BACKGROUND OF THE INVENTION

1. Field of the Invention

The invention relates to computer clocking systems, and more particularly, to methods of and devices for correcting edge placement errors, both positive and negative, during the coasting phases in multiplying phase-locked loops to generate local system clock signals from master clock signals.

2. Description of the Related Art

In efforts to realize greater computing power, microprocessor developers have continuously pushed the clock speeds ever higher. As few as ten years ago, microprocessor clock frequencies of 16 MHz were rare. Today, one sees microprocessors running at frequencies of 50 MHz and even higher.

With these higher clock frequencies have come concurrent problems. Distribution of a 50 MHz clock to the various components of a digital computer system can present difficulties associated with electromagnetic interference (EMI), clock skew, and reflections of the higher harmonics of the system clock signal. Transmission of high frequency clock signals over connectors to companion boards exacerbates these problems.

Developers have sought creative solutions to these problems. One approach has been to rely on a lower frequency system clock, and then generate, on the microprocessor or peripheral chip itself, a higher frequency clock signal from that lower frequency system clock. A number of current microprocessors and peripheral chips implement such a technique, for example, the 80486DX2 by Intel Corporation. This technique has the advantage of increasing a chip's internal processing rate without requiring a corresponding increase in system clock frequency, thus avoiding the problems associated with those higher clock rates.

To generate these higher frequency internal clock signals, these chips typically use a phase-locked loop (PLL) configured as a frequency multiplier. A block diagram of such a frequency multiplier circuit is shown in FIG. 1. As is shown, a phase detector (or phase comparator) drives, through a filter, a voltage controlled oscillator (VCO). The output of that VCO, which becomes the output signal, is then divided by the desired multiplication factor, and then the phase detector compares that divided reference signal with the input signal. This feedback arrangement compensates for shifts in the phase and frequency of the input signal by a level shift to the VCO, and the output signal is thus synchronized to the input signal. Examples of PLLs that can be configured as frequency multipliers include the CD4046A by RCA Corporation and the 74LS297.

The phase detector has two main purposes. First, it forces the VCO to shift frequencies when the reference signal and the input signal are of different frequencies. Second, it forces slight corrections to the VCO output when the reference and input signals are of the same frequency but are slightly out of phase. Both of these functions are accomplished by adjusting the frequency of the VCO; it is simply a difference of the magnitude of the adjustment.

Multiplying PLL's, however, have certain characteristics that can cause their own problems. In a multiplying PLL the synchronizing frequency is less than the clock signals used as outputs of the PLL. For example, in a multiply by four PLL, the input and synchronizing frequency may be 12.5 MHz, but a 50 MHz output frequency may be used. This means that four cycles of the output signal will pass before the next synchronizing edge. During this period the PLL is considered to be coasting. The synchronizing signal may be exactly locked onto the input signal, but the output signal may have some drifts during the coasting period. For example, while the total number of cycles in the coasting period may be the multiplying factor, the location of the particular rising and falling edges defining the output signal cycles during the coasting period may not be exactly the same. For example, some cycles may be slightly longer than others, resulting in a slight wobble or dither during the coasting period. These errors are referred to as edge placement errors. Additionally, there may also be duty cycle variations. These problems increase, relatively, as the multiplying factor and PLL frequency increase. As an example, in the PLL of the preferred embodiment, a 12.5 MHz input clock is used, with 25 and 50 MHz outputs. Referring to the 50 MHz output, the 80 ns coasting period results in four 20 ns cycles of the 50 MHz signal. In certain observations without the use of the present invention, the four cycles actually had lengths of slightly more than 20 ns, slightly more than 19 ns, slightly more than 20 ns and slightly more than 19 ns, the total being 80 ns, but the individual cycles varying from the ideal 20 ns by as much as 3–5%.

Microprocessors and their support chips typically have minimum and maximum allowable clock input frequencies, duty cycles and cycle to cycle tolerances. For example, the 80486DX-50 microprocessor from Intel Corporation requires the clock period stability to be within 0.1%. The duty cycle is similarly critical, with a minimum time of 7 ns at high and 7 ns at low signal levels, with transitions being less than 2 ns each. This means that the duty cycle variability in a 50 MHz system having a 20 ns cycle time is very minor and must be very close to 50%.

This very tight tolerancing, particularly the adjacent clock 0.1% value, results in problems when used with a multiplying PLL such as the one described above where the adjacent clock variations may reach 5%. Some solution is needed to reduce the adjacent clock variations to acceptable levels.

SUMMARY OF THE INVENTION

The method of and apparatus for correcting edge placement errors in a multiplying PLL circuits utilizes an interim frequency output signal as a feedback term applied to the VCO input. The clocking arrangement of a computer according to the preferred embodiment uses a relatively low frequency master clock signal that is distributed to various boards of a digital computer system. A number of identical clock generation integrated circuits, constructed according to the principles of the invention, then generate the local clock signals needed by the various components of the digital computer system. These clock generation chips are typically located near those components that require the higher frequency clocks.

The clock generation chips use PLLs to generate the local clock signals. The PLLs can be configured as frequency multipliers, in which case the frequencies of the local clock signals will be a multiple of the master clock frequency. These PLLs generate the highest required frequency clocks, and then dividers generate other, lower speed, required clock signals from that high frequency clock signal. These various clock signals are then driven to the various components that need them. Further dividers provide the synchronizing clock signal back to the phase detector. Thus three different frequency signals are present, a highest frequency, an intermediate frequency and a lowest frequency. The highest frequency signal is used to drive the microprocessor, while the intermediate frequency is used as the clocking signal for a shared bus and the lowest frequency is used for synchronizing purposes.

The basic PLL in the clock generation chip exhibits the common edge placement errors, as described above, when used without compensation according to the present invention. Details of the adjacent clock errors are described above. To resolve these errors a signal incorporating the intermediate frequency signal is fed back into the input of the VCO in the PLL. In the preferred embodiment the three produced signals are synchronized so that they all have a common rising edge. With the variance described above, namely 20+ ns, 19+ ns, 20+ ns and 19+ ns, the variation can be seen as being in basic synchronization with the intermediate frequency signal. Simply feeding the intermediate frequency signal back to the VCO input through an appropriate divider resolves the adjacent clock problem but increases the duty cycle variation or nonsymmetry to a level unacceptable to the preferred microprocessor. Thus a version of the intermediate frequency signal is developed, but slightly time advanced or leading. This signal is provided to the low pass filter between the phase detector and the VCO. The slight leading nature corrects the duty cycle variation and yet still allows the adjacent clock variations to be reduced to satisfactory levels.

BRIEF DESCRIPTION OF THE DRAWINGS

A better understanding of the present invention may be obtained when the detailed description of the preferred embodiment is considered in conjunction with the following drawings, in which.

DETAILED DESCRIPTION OF THE PREFERRED EMBODIMENT

Figure 1:
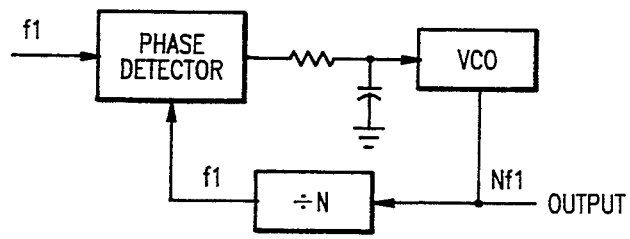
FIG. 1 is a prior art block diagram of a phase-locked loop configured as a frequency multiplier.
Figure 2:
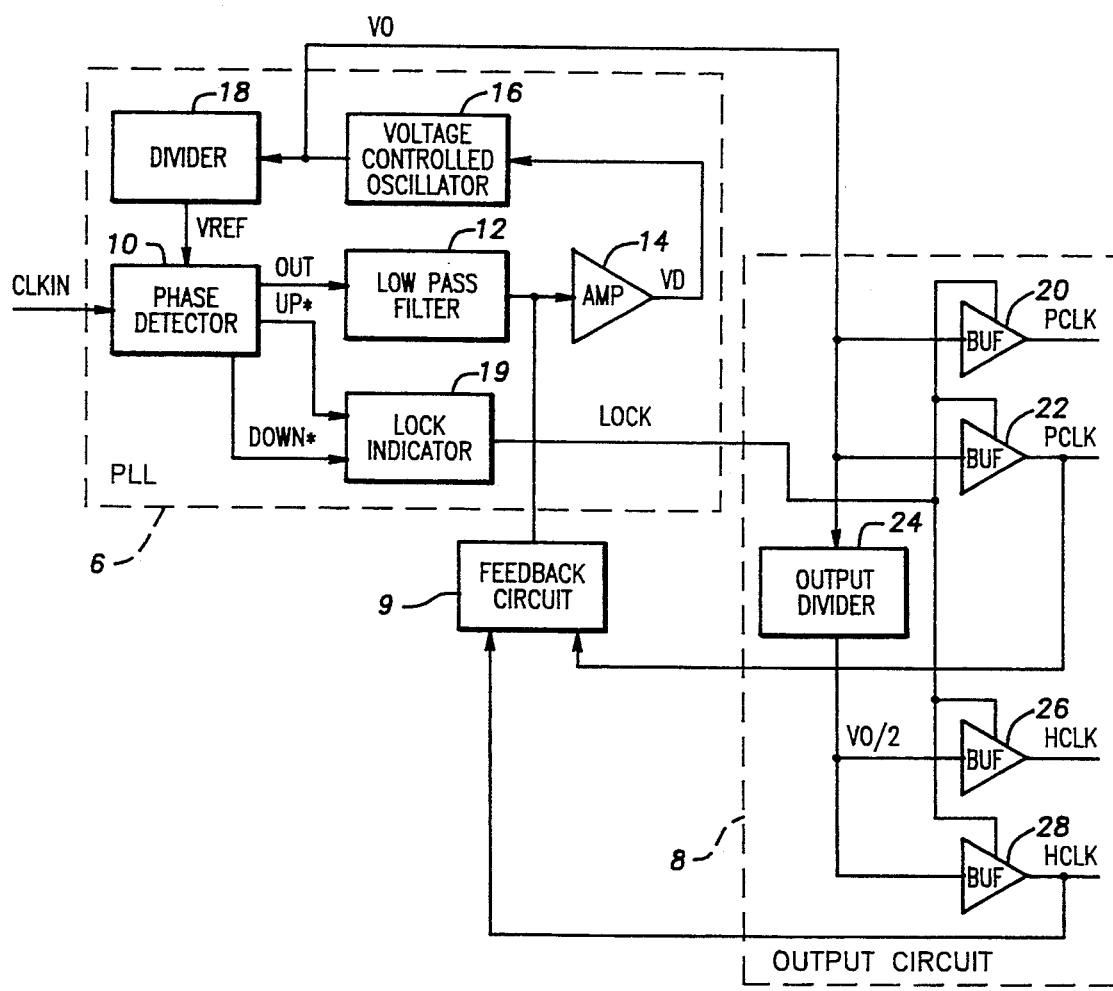
FIG. 2 is a block diagram showing the elements of a phase-locked loop based clock generation circuit along with its startup elements and edge placement error reduction circuitry according to the invention.

Turning to the drawings, FIG. 2 shows a block diagram of the circuit elements of an integrated circuit constructed according to the invention. The diagram in FIG. 2 shows PLL circuitry 6, output circuitry 8 and feedback circuitry 9.

As an input, the signal CLKIN is provided as a master clock signal. The frequency of CLKIN is of course arbitrary, but in this embodiment is 12.5 MHz. CLKIN will typically be a square wave, but could be any periodic signal that can drive a PLL, such as a sine wave. A sine wave would typically be first passed through a buffer to convert it into a square wave.

The signal CLKIN is provided to a phase detector 10. The phase detector 10 can be constructed in a variety of ways; the circuit used in this embodiment is described later in the discussion of FIG. 5. In this embodiment, the phase detector 10 provides three signals: UP*, DOWN*, and OUT. The signal OUT is filtered through a low pass filter 12, and then driven into an amplifier 14. The feedback circuitry 9 provides an output also connected to the input of the amplifier 14 in a summing arrangement. The amplifier 14 provides a control voltage VD to a voltage controlled oscillator (VCO) 16, which generates a square wave signal VO. VO is then divided by a divider 18. The divider 18 can conceivably divide VO by any integral value, but in this embodiment divides the signal VO by four. This divided signal then becomes the reference signal VREF, which is fed back as a reference input signal into the phase detector 10.

In operation, the phase detector 10, low pass filter 12, amplifier 14, VCO 16, and divider 18 form a PLL configured for frequency multiplication. When the PLL is locked, the output signal VO is in phase with CLKIN, and is an integral multiple of the frequency of CLKIN. In this embodiment VO is a 50 MHz square wave, as CLKIN is a 12.5 MHz signal.

Also associated with the PLL circuitry 6 is a lock indicator 19. The lock indicator 19 is driven by the UP* and DOWN* signals from the phase detector 10, and is described later in the discussion of FIG. 4. When the lock indicator 19 determines that the phase detector 10 indicates that the PLL circuitry 6 is locked onto CLKIN, the lock indicator 19 delays for an arbitrary amount of time and then asserts an active high lock indication signal LOCK. This delay ensures that the PLL circuitry 6 has locked in on CLKIN, that CLKIN is stable, and that the PLL circuitry is stable. When the lock indicator 19 asserts LOCK true, or high, the output circuitry 8 becomes active. At all times, VO drives the inputs of high frequency output buffers 20 and 22. The high frequency output buffers 20 and 22 are tri-state buffers and are disabled and enabled by the signal LOCK. When LOCK is asserted high, the high frequency output buffers 20 and 22 are switched from a tri-state condition to an enabled condition. The high frequency output buffers 20 and 22 are then driving the signal VO as their output signal PCLK or processor clock. Of course, as few or as many output buffers as desired can be added to this design.

The signal VO is also divided by the output divider 24. This is a divide-by-two divider, and can be a flip-flop, for example. The output divider 24 provides a divided output signal VO/2, which is input to low frequency output buffers 26 and 28, which are also tri-state buffers and provide the HCLK or host bus clock signal.

These buffers 26 and 28 are enabled and disabled by LOCK in the same way as the high frequency output buffers 20 and 22.

DIGITAL PHASE DETECTOR

Figure 3:
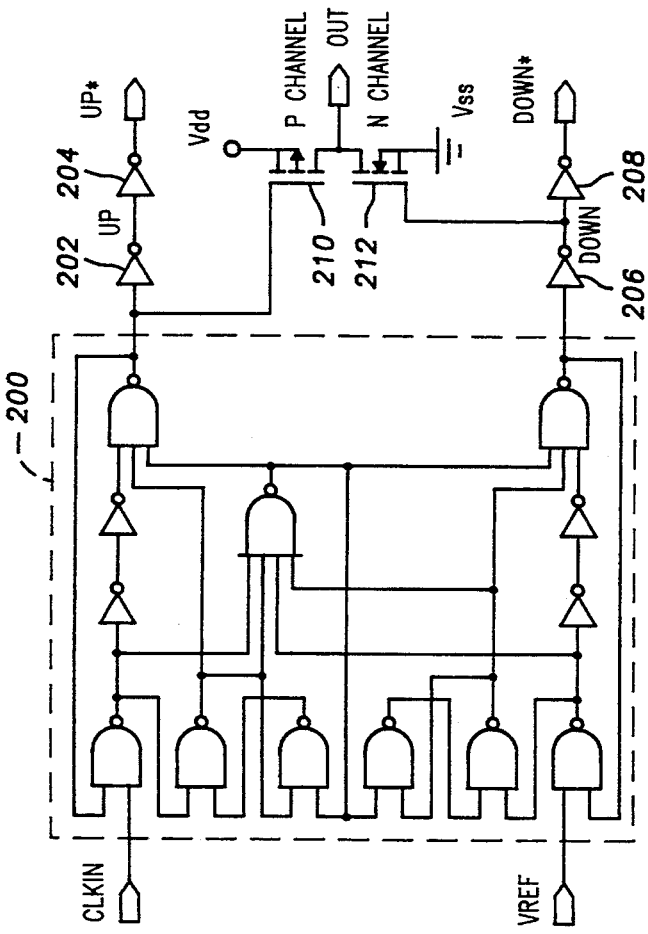
FIG. 3 is a schematic of a typical digital phase detector used in a circuit built according to the block diagram in FIG. 2.

FIG. 3 shows a schematic for the phase detector 10 as used in this embodiment. A variety of circuits could be used, but the particular circuit shown in FIG. 5 has the advantages of not being dependent upon the duty cycles of CLKIN and VREF, and the advantage of providing for a very small phase shift between CLKIN and VREF. In the circuit of FIG. 3, CLKIN and VREF are provided as input signals to digital phase detection circuitry 200, which provides, through inverters 202, 204, 206 and 208, the output signals UP* and DOWN*. When the frequency of CLKIN is greater than the frequency of VREF, UP* goes continuously low, or true. Conversely, when the frequency of CLKIN is less than the frequency of VREF, DOWN, goes continuously low, or true. If the frequencies of CLKIN and VREF are the same, but CLKIN lags VREF, then DOWN* is maintained low for a time corresponding to the phase difference. Conversely, if CLKIN leads VREF, then UP* is maintained low for a period corresponding to the phase difference.

An OUT signal is used to drive the low pass filter 12. OUT can be generated by a push-pull pair of MOSFETs. The gate of a p-channel MOSFET 210 is driven by the UP* signal, while its source is connected to Vdd. The gate of an n-channel MOSFET 212 is driven by the DOWN signal, while its source is connected to ground. The drains of both MOSFETS 210 and 212 are tied together, and provide the signal OUT. When UP* goes low, a p-channel MOSFET 210 turns on, driving OUT to Vdd. When DOWN goes high, the n-channel MOSFET 212 turns on, driving OUT to ground. When neither UP nor DOWN is true, OUT is in a high impedance state. Other circuits could be used to convert the two DOWN* and UP* signals to the single OUT signal. OUT is filtered through the low-pass filter 12 and the resulting filtered signal driven into the amplifier 14. The amplified signal then adjusts the VCO 16 to maintain VREF and CLKIN at the same frequency and phase.

LOCK INDICATOR

Figure 4:
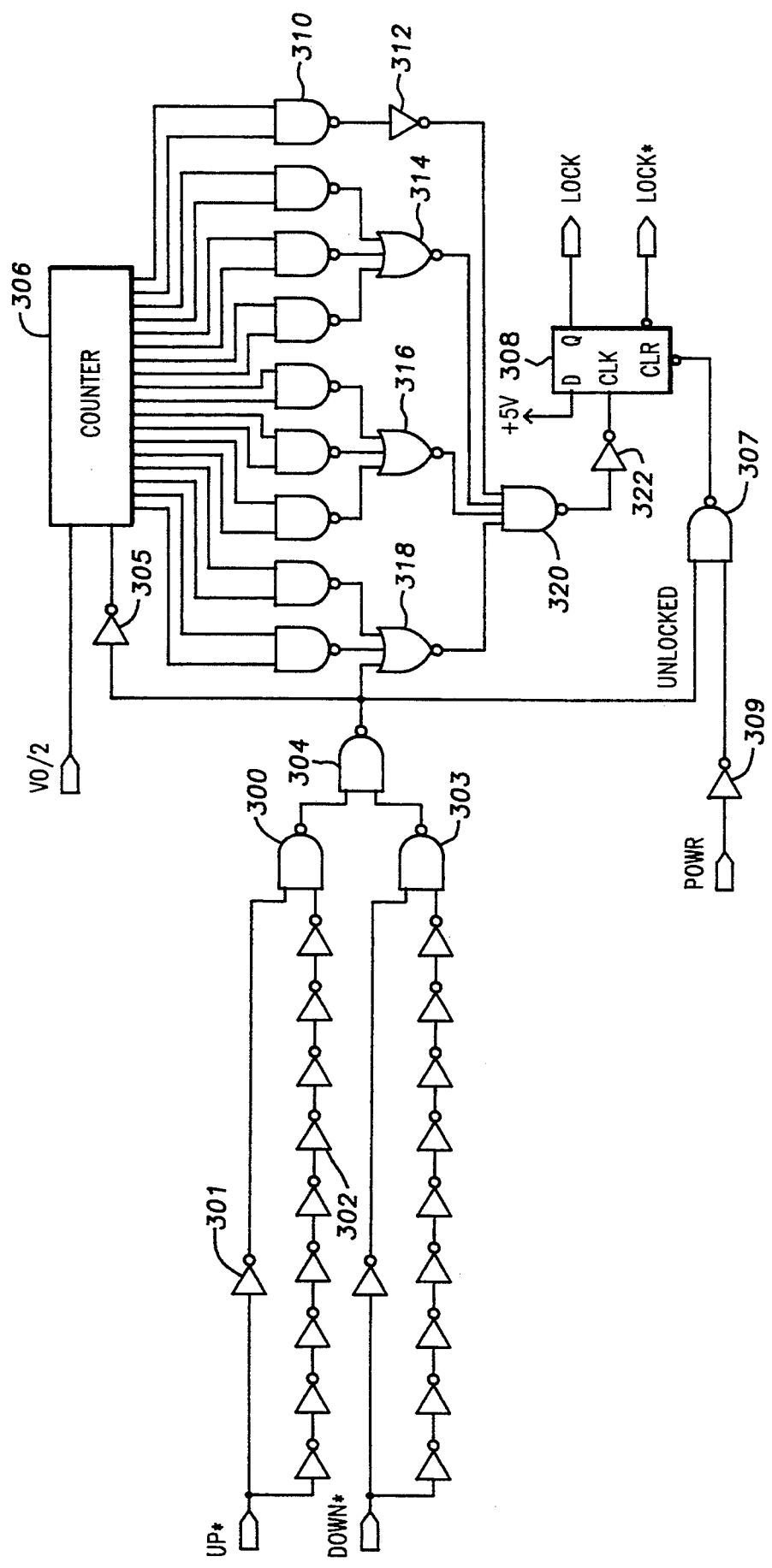
FIG. 4 is a schematic of a typical delay circuit used in the lock indicator of a circuit built according to the block diagram in FIG. 2.

FIG. 4 shows a schematic of the circuitry used to implement the lock indicator 19. As inputs, FIG. 4 uses the signals UP* and DOWN* provided by the phase detector 10, as shown in FIG. 3. When UP* goes low, or true, a high signal goes to one input of a NAND gate 300 via an inverter 301 and the active low UP* signal also goes through a series of inverters 302. The series of inverters 302 functions as a delay line to the NAND gate 300 so that very narrow UP* signal pulses are filtered. These pulses are those generated by the phase detector 10 in normal operation to adjust for slight drifts in the phase of VREF. Thus, only when UP* goes low for a period of time long enough for that low signal to traverse the series of inverters 302 will the output of the NAND gate 300 go low, or true. The DOWN* signal uses corresponding circuitry. When the output of the NAND gate 300 goes low, that indicates that the PLL is no longer in lock. So, the output of a second NAND gate 304, which receives the outputs of the NAND gate 300 and the corresponding NAND gate 303 in the DOWN* circuitry, correspondingly goes high. The output of the NAND gate 304 is the UNLOCKED signal, which is provided to an inverter 305 and one input of a NAND gate 307. The inverter 305 has its output connected to the inverted clear input of a counter 306. The second input of the NAND gate 307 is connected to the output of an inverter 309, which receives the POWR or power-on reset signal at its input. This signal stays high until Vdd rises to an arbitrary voltage level, here being 2.0 volts. The output of the NAND gate 307 is connected to the inverted clear input of a flip-flop 308. So when the output of NAND gate 304 is high, the counter 306 is cleared and the flip-flop 308 is cleared after the reset period.

When UP* and DOWN* are once again both high, and thus the PLL is locked, then the NAND gate 304 output is low, and the counter 306 begins counting. The clock for the counter 306 is VO/2, which runs at 25 MHz. The counter 306 has 18 stages going into a series of 9 two input NAND gates 310. When all 18 lines of the counter 306 are true, the series of NAND gates 310 outputs are all low. The output of one NAND gate 310 is inverted by an inverter 312 and provided as one input to a NAND gate 320. The outputs of three NAND gates 310 are provided to the inputs of a NOR gate 314, whose output is connected to the NAND gate 320. The outputs of three more NAND gates 310 are provided to the inputs of a NOR gate 316, whose output is also connected to NAND gate 320. The final two NAND gates 310 are connected to inputs of a NOR gate 318. The third input of the NOR gate 318 receives the UNLOCKED signal from the NAND gate 304. The output of the NOR gate 318 is the final input to the NAND gate 320. The output of the NAND gate 320 is inverted by an inverter 322, whose output is connected to the clock input of the flip-flop 308. The D input of the flip-flop 308 is connected to a logic high level. The noninverted and inverted outputs of the flip-flop 308 are the LOCK and LOCK, signals, respectively.

As the counter 306 counts up and all the outputs are true and the PLL is still locked, the flip-flop 308 is clocked and the LOCK signal goes true. If lock is lost for greater than a minimal period, then the counter 306 and the flip-flop 308 are cleared and the LOCK signal goes false. The counter 306 thus provides a lock delay period of approximately 10 milliseconds.

DETAILS OF THE EMBODIMENT

Figure 5:
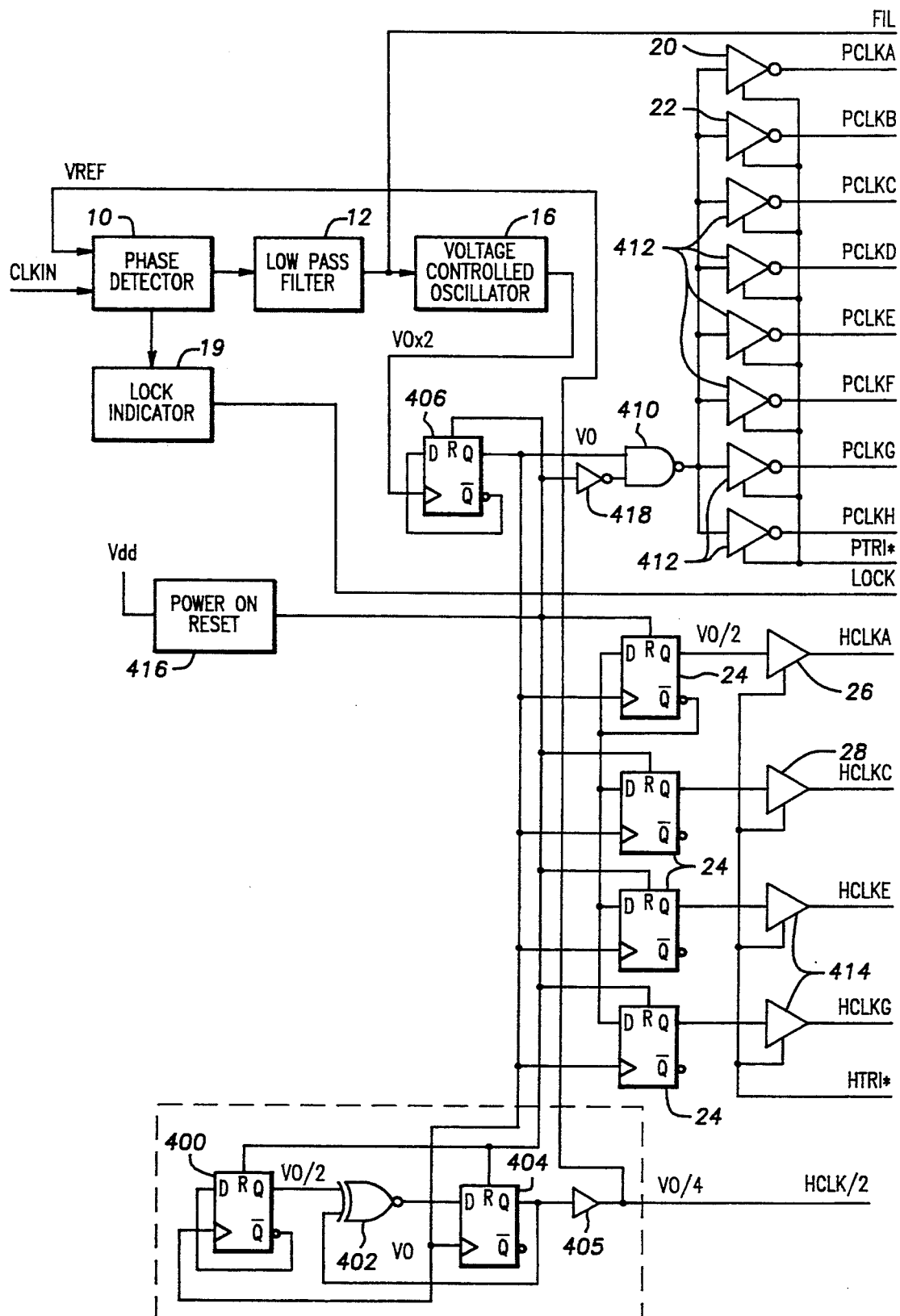
FIG. 5 is a combination schematic and block diagram of an integrated circuit constructed according to the invention used to generate high frequency local clocks from a master clock signal.

FIG. 5 shows a schematic of portions of the internal circuitry of an integrated circuit actually implemented according to the invention. Shown are the phase detector 10, the low-pass filter 12, the VCO 16, the divider 18, the lock indicator 19, and the output divider 24.

Also shown are the high frequency output buffers 20 and 22 and the low frequency output buffers 26 and 28. The enables for the high frequency output buffers 20 and 22 are driven by the signal PTRI*. Similarly, the enables for the low frequency output buffers 26 and 28 are driven by the signal HTRI*. These inputs are active high in the sense that the outputs are enabled when PTRI* and HTRI* are high and tri-stated when the signals PTRI* and HTRI* are low.

The divider 18 is shown, being made up of a first D flip-flop 400, an inverting output XOR gate 402, a second D flip-flop 404, and a driver 405. The first D flip-flop 400 has as its clock input the signal VO. The inverting output of the first D flip-flop 400 is tied to its D input. Thus, the signal out of the first D flip-flop 400 is VO/2. The noninverting output of the first D flip-flop 400 is connected to one input of the inverting output XOR gate 402. The other input is connected to the noninverting output of the second D flip-flop 404. The output of the inverting output XOR gate 402 is connected to the D input of the second D flip-flop 404. The noninverting output of the second D flip-flop 404 is also connected to a driver 405. The output of the driver 405 is the signal VO/4 and becomes the reference input VREF of the phase detector 10.

In FIG. 5, an additional divider 406 is provided between the output of the VCO 16 and the line carrying the signal VO. Thus, for VO to be a 50 MHz signal, for example, the VCO 16 must generate VO times two, which is a 100 MHz signal.

The output of the additional divider 406 then becomes the signal VO and drives the high frequency output buffers 20 and 22, as well as additional high frequency buffers 412, through a NAND gate 410. The output of the additional divider 406 also drives the low frequency output buffers 26 and 28, as well as additional low frequency buffers 414, through the output divider 24, which here is a series of D flip-flops, one for each output. The output of the additional divider 406 drives the clock of each flip-flop making up the output divider 24. One inverting output of this series of D flip-flops making up the output divider 24 is tied to the D input of each flip-flop. The non-inverting outputs then are connected to the low frequency output buffers 26 and 28, as well as additional low frequency buffers 14.

Power-on reset circuitry 416 detects when Vdd goes on, and then drives an active high RESET signal to the reset input of the additional divider 406, an input of the NAND gate 410 through an inverter 418, the reset input of each D flip-flop making up the output divider 24, and the reset inputs of the first D flip-flop 400 and the second D flip-flop 404 in the divider 18. Finally, the lock indicator 19 provides the active high lock indication signal LOCK.

Figure 6:
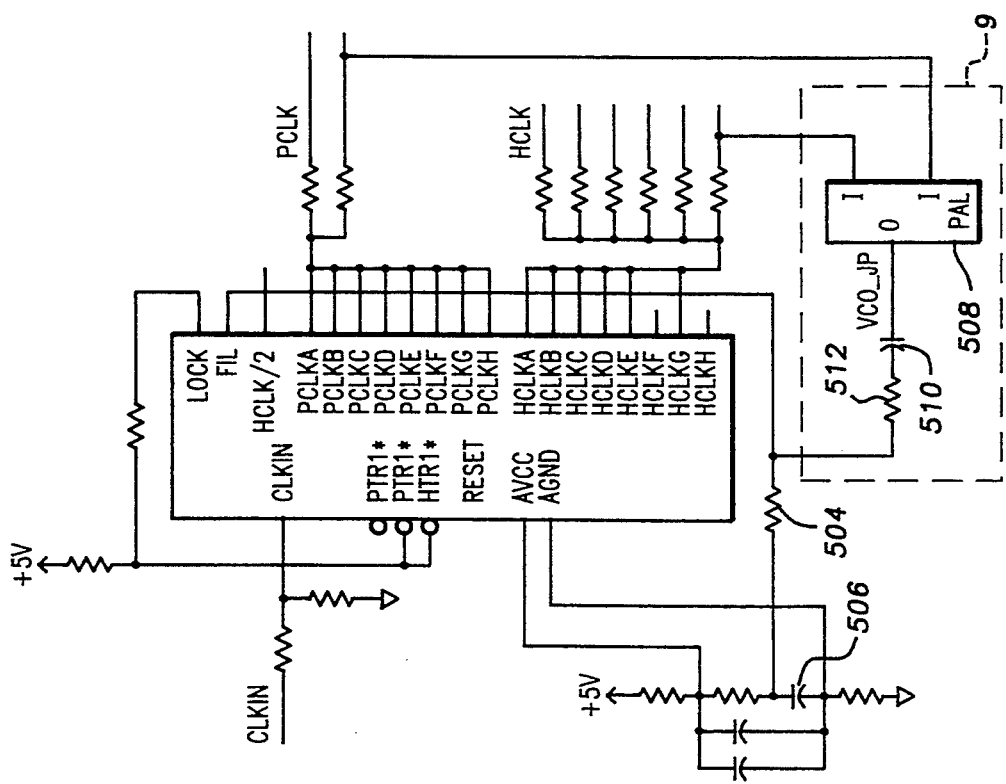
FIG. 6 is a schematic showing typical external circuitry used to drive the integrated circuit of FIG. 5.

An integrated circuit constructed according to the invention as illustrated in the schematic of FIG. 5 is configured as shown in FIG. 6 when used in a digital computer system. Specifically, CLKIN is a 12.5 MHz system clock. The LOCK output feeds into the PTRI* and HTRI* inputs of the chip. When LOCK goes high, PTRI* is driven high, which enables the high frequency output buffers 20 and 22. Similarly, HTRI* is also asserted high, enabling the low frequency output buffers 26 and 28.

Finally, the FIL line, which is part of the low-pass filter 12, goes into an RC network consisting of a resistor 504 and a capacitor 506. This RC network assists in converting the digital OUT signal output by the phase detector 10 to an analog signal suitable for input to the VCO 16.

The feedback circuit 9 also has an output connected to the FIL line. As noted above, the clock generator chip of the preferred embodiment according to FIG. 5 has some edge placement errors on the PCLK signal outputs during the coasting portion of the VCO cycle. Particularly, the first PCLK signal cycle has been measured as being slightly greater 20 ns, the second cycle greater than 19 ns, the third cycle greater than 20 ns and the fourth cycle in the coasting period being greater than 19 ns, so that relatively significant adjacent clock errors are occurring. The PCLK, HCLK and HCLK/2 signals are synchronized to have a common rising edge. With this characteristic noted, the variations in the PCLK signal cycles are observed as repeating with the level of the HCLK signal.

With this relationship, it was tried to feedback the HCLK signal to the input of the VCO 16. A series resistor/capacitor network was connected between the FIL signal and an HCLK signal output. The resistor and capacitor values were developed by experimentation to transfer a sufficient signal back to cause the VCO 16 to reduce the cycle length, or increase the frequency, during the high portion of the HCLK signal and increase the cycle length during the low portion of the HCLK signal to bring the cycle lengths of the PCLK signal back to uniformity. Exact values will depend on the component values of the resistor 504, the capacitor 506 and the amount of error present. This simple feedback was successful in correcting the cycle length variations, but also resulted in changing the duty cycle of the PCLK signal. This may not be a problem in many designs, but using the PCLK signal to drive a microprocessor such as the 80486DX-50 from Intel, the duty cycle limits were being approached.

It was then determined that by using a slightly earlier version of the HCLK signal, the duty cycle problem could be corrected. The slightly earlier timing adjusts for the slight delay factor developed by the capacitor 506 and present in the VCO 16 and the basic HCLK period and timing is sufficient to correct the cycle length variations. Thus the preferred feedback circuit 9 according to the present invention corrects both duty cycle and cycle length problems.

A programmable array logic or PAL device 508 receives the HCLK and PCLK signals as inputs and develops the VCO_JP signal as an output. The equation is as follows:

$$VCO\_JP = HCLK^* \cdot PCLK^* + \\ VCO\_JP \cdot PCLK + \\ HCLK^* \cdot VCO\_JP$$

The first term causes the VCO_JP signal to go to a high level ½ PCLK signal before the HCLK signal goes high, the second term extends the VCO_JP signal to have the length of the HCLK signal and the third term is the cover term. Therefore the VCO_JP signal has the frequency and duty cycle of the HCLK signal, but starts approximately ½ PCLK signal cycle earlier. Given propagation delays and the frequencies of interest, the VCO_JP signal actually goes high approximately ¼ PCLK signal before the HCLK signal.

The VCO_JP signal is provided to one terminal of a capacitor 510. The second terminal of the capacitor 510 is connected to one terminal of a resistor 512. The second terminal of the resistor 512 is connected to the FIL signal. In this manner the VCO_JP signal is provided to the input of the VCO 16. The resistor 512 and capacitor 510 values are chosen so that the voltage increase on the FIL signal when the VCO_JP signal is high and the voltage reduction of the FIL signal when the VCO_JP signal is low is sufficient to correct the cycle length variations without unduly affecting the duty cycle of the PCLK signal. The slightly leading nature of the VCO_JP signal has the advantage of having the low state at a time such that the induced ripple on the FIL signal reduces in sufficient time to prevent delay of the falling edges and resultant duty cycle variations, both due to the integrating effects of the capacitor 506 and any delay in the VCO 16.

Therefore the feedback circuit 9 corrects the edge placement errors present in the clock generator chip of FIG. 5 without requiring access to the internal operations of the VCO 16, allowing a simple external correction. A signal of approximately the frequency and phase of the cycle length variation is fed back to the VCO 16 input to correct errors. Of course, other signals could be utilized if different phase or frequency variations were noted, the feedback signal being of the proper phase and frequency to match and counteract the variations.

Figure 7:
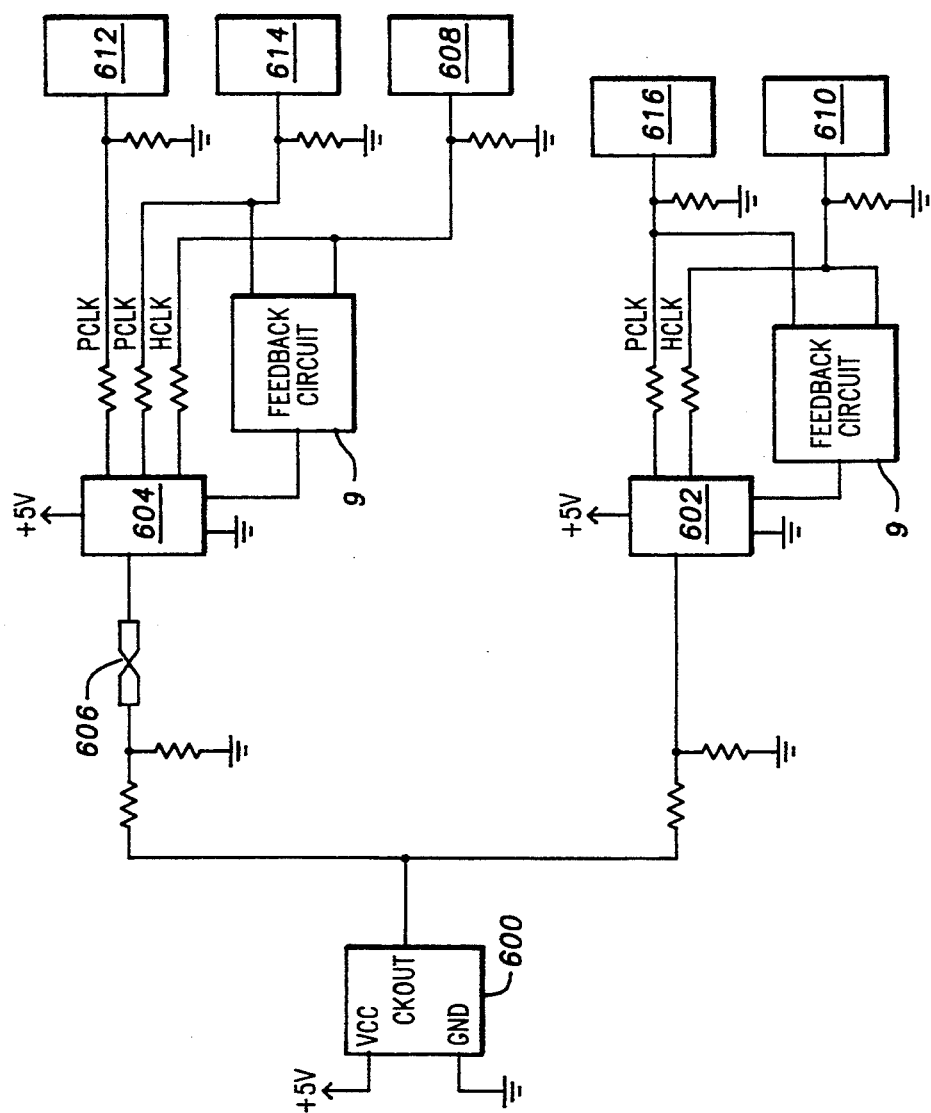
FIG. 7 is a schematic and block diagram showing a number of integrated circuits as shown in FIG. 5 used in a system to generate high frequency local clock signals from a lower frequency master clock signal according to the invention.

Finally, FIG. 7 shows how the integrated circuit constructed according to the invention as shown in FIG. 5 is used in a system. A master clock circuit 600 generates the 12.5 MHz system clock CLKIN. This clock is distributed to both an onboard clock generator chip 602 and an offboard clock generator chip 604, these chips being constructed according to the schematic and block diagram of FIG. 5. The offboard clock generator chip 604 is located on a separate board connected to the main system board by a connector 606.

The onboard clock generator chip 602 and the offboard clock generator chip 604 generate a 50 MHz clock signal PCLK and a 25 MHz clock signal HCLK. These signals are local clock signals for use by peripheral chips 608, 610, 612, 614 and 616. The generator chips 602 and 604 can be repeated as desired to provide local clock signals to other peripheral chips. Of course, according to the invention, these signals are tri-stated until the PLLs on the onboard clock generator chip 602 and the offboard clock generator chip 604 stabilize. FIG. 7 shows PCLK as being provided to peripheral chips 608 and 610, while HCLK is provided to peripheral chips 612, 614 and 616. Of course, the number of chips which require each frequency is arbitrary, and in fact one chip could receive both frequencies of clock signal. Each clock generator chip 602 and 604 has associated with it a feedback circuit 9 to allow correction of edge placement errors present in the clock generator chips 602 and 604.

The offboard clock generator chip 604 and onboard clock generator chip 602 are typically located physically near the chips that use their local clock signals. This prevents transmission line problems associated with transmitting high frequency clock signals over long traces. In a typical system, chips using the 50 MHz signal would include, for example, the 50 MHz 80486DX microprocessor and the 82495 cache controller, both by Intel Corporation. Examples of chips using the 25 MHz clock would be the 82490 cache SRAM, also by Intel. By delaying the provision of the PCLK and HCLK signals to these devices until the PLL in the clock generator chip 604 is stable, the devices do not receive a clock signal that is out of specification or rapidly changing. Additionally, by correcting the edge placement errors using feedback circuits 9 according to the present invention, adjacent clock signal periods and duty cycles are within specification of the peripheral chips.

This invention has been described in terms of particular embodiments. Obviously, modifications and alterations will be apparent to those skilled in the art in view of this disclosure. It is therefore intended that all such equipments, modifications, and variations fall within the spirit and scope of the invention as claimed.

We claim:

1. A method for correcting repeating edge location errors of high frequency output signals developed during a coasting period of a multiplying phase locked loop, the phase locked loop including a phase detector for comparing an input signal and a reference signal, a low pass filter for filtering the output of the phase detector, a voltage controlled oscillator receiving the output of the low pass filter at its input and a divider for dividing the output for the voltage controlled oscillator to form the reference signal, the phase locked loop having an output signal having a frequency greater than the frequency of the reference signal, the method comprising the steps of:

developing a feedback signal responsive to the output signal of the phase locked loop, said feedback signal having the frequency and approximately the phase of the repetition of the edge location errors; and coupling said feedback signal to the input of the voltage controlled oscillator of said phase locked loop to cause a reduction in the edge location errors.

2. The method of claim 1, wherein said step of developing a feedback signal develops said feedback signal so that the phase of said feedback signal is slightly leading the phase of the repetition of the edge location errors.

3. The method of claim 1, wherein said feedback signal is connected to the input of the voltage controlled oscillator and summed with the output of the low pass filter connected to the input of the voltage controlled oscillator.

4. A circuit for correcting repeating edge location errors of high frequency outputs developed during a coasting period of a multiplying phase locked loop, the phase locked loop including a phase detector for comparing an input signal and a reference signal, a low pass filter for filtering the output of the phase detector, a voltage controlled oscillator receiving the output of the low pass filter at its input and a divider for dividing the output for the voltage controlled oscillator to form the reference signal, the phase locked loop having an output signal having a frequency greater than the frequency of the reference signal, the circuit comprising:

means responsive to the output of the phase locked loop for developing a signal having a frequency of and being approximately in phase with the repetition of the edge location errors; and means for coupling said signal to the input of the voltage controlled oscillator to cause a reduction in the edge location errors.

5. The circuit of claim 4, wherein said signal developing means develops said signal so that the phase of said signal is slightly leading the phase of the repetition of the edge location errors.

6. The circuit of claim 5, wherein said means for coupling includes a series connection of a resistor and a capacitor between the input of the voltage controlled oscillator and the signal output of said signal developing means.

7. The circuit of claim 4, where the phase locked loop divider divides by four and wherein said signal developing means develops said signal to have a frequency of one-half the output frequency of the voltage controlled oscillator.

8. The circuit of claim 7, wherein said signal developing means develops said signal to have a phase leading the phase of the repetition of the edge location errors by approximately one-half cycle of the voltage controlled oscillator output frequency.

9. The circuit of claim 8, wherein said means for coupling includes a series connection of a resistor and a capacitor between the input of the voltage controlled oscillator and the signal output of said signal developing means.

* * * * *